United States Patent
Afzali-Ardakani et al.

(10) Patent No.: US 7,940,381 B2
(45) Date of Patent: May 10, 2011

(54) SEMICONDUCTOR NANOWIRE ELECTROMAGNETIC RADIATION SENSOR

(75) Inventors: Ali Afzali-Ardakani, Ossining, NY (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 12/324,151

(22) Filed: Nov. 26, 2008

(65) Prior Publication Data

US 2010/0128260 A1 May 27, 2010

(51) Int. Cl.
*H01L 31/0352* (2006.01)
(52) U.S. Cl. .......... 356/213; 257/9; 257/428; 257/253; 428/368; 977/762
(58) Field of Classification Search .......... 257/428, 257/253, E29.242, 9, E31.032, E21.211; 428/368, 375, 389; 977/762; 356/213
See application file for complete search history.

(56) References Cited

U.S. PATENT DOCUMENTS

| 6,882,051 B2 * | 4/2005 | Majumdar et al. ............ 257/746 |
| 2004/0113165 A1 | 6/2004 | Li et al. |
| 2006/0137741 A1 | 6/2006 | Park et al. |
| 2007/0085155 A1 | 4/2007 | Borghetti et al. |
| 2008/0149171 A1 | 6/2008 | Lu et al. |

FOREIGN PATENT DOCUMENTS

| EP | 1 087 446 A2 | 3/2001 |
| WO | 2004112163 A1 | 12/2004 |

OTHER PUBLICATIONS

Xu, H.B. et al., "A Novel Donor-Acceptor Heterojunction from single-Walled Carbon Nanotubes Functionalized by Erbium Bisphthalocyanine" Materials Chemistry and Physics (2005) pp. 342-346, vol. 94.
International Search Report dated Dec. 8, 2009.
Kosbar et al., "Self-Assembled Multilayers of Transition-Metal-Terpyridinyl Complexes; Formation, and Characterization", Langmuir 2006, pp. 7631-7638, American Chemical Society.

* cited by examiner

*Primary Examiner* — Michael B Shingleton
(74) *Attorney, Agent, or Firm* — Scully, Scott, Murphy & Presser, P.C.; Vazken Alexanian

(57) ABSTRACT

A semiconductor nanowire is coated with a chemical coating layer that selectively attaches to the semiconductor material and which forms a dye in a chemical reaction. The dye layer comprises a material that absorbs electromagnetic radiation. A portion of the absorbed energy induces electronic excitation in the chemical coating layer from which additional free charge carriers are temporarily donated into the semiconductor nanowire. Thus, the conductivity of the semiconductor nanowire increases upon illumination on the dye layer. The semiconductor nanowire, and the resulting dye layer collective operate as a detector for electromagnetic radiation.

25 Claims, 6 Drawing Sheets

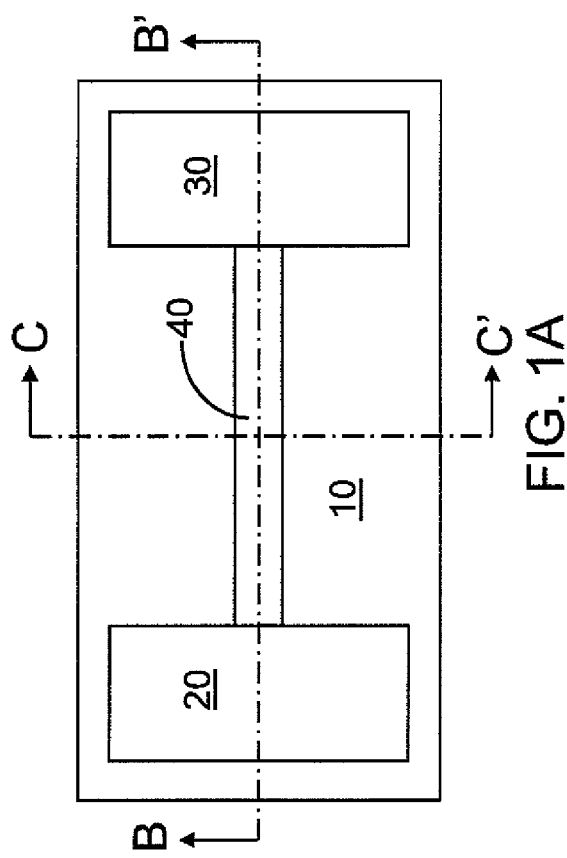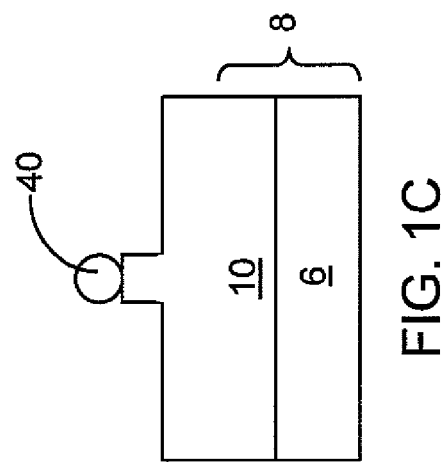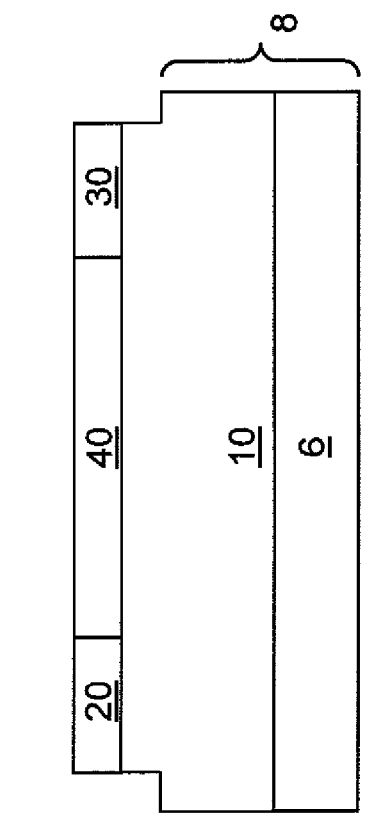

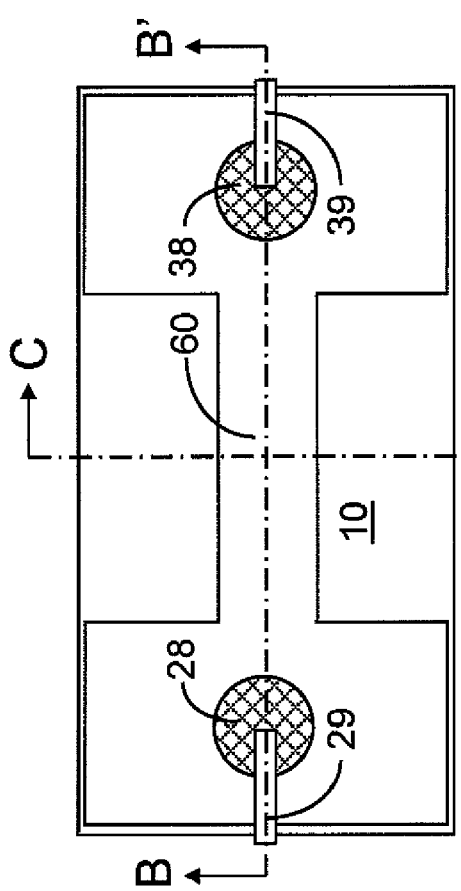
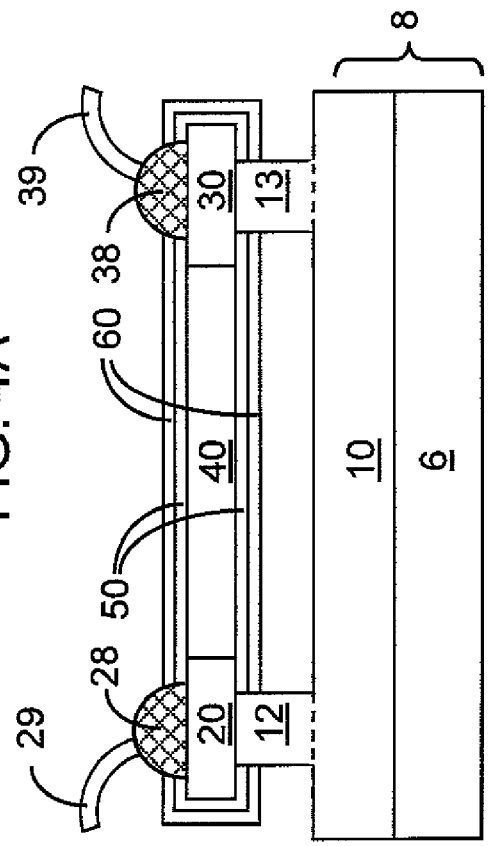
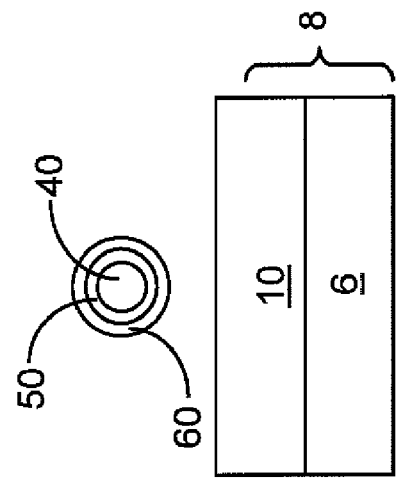
FIG. 4A
FIG. 4B
FIG. 4C

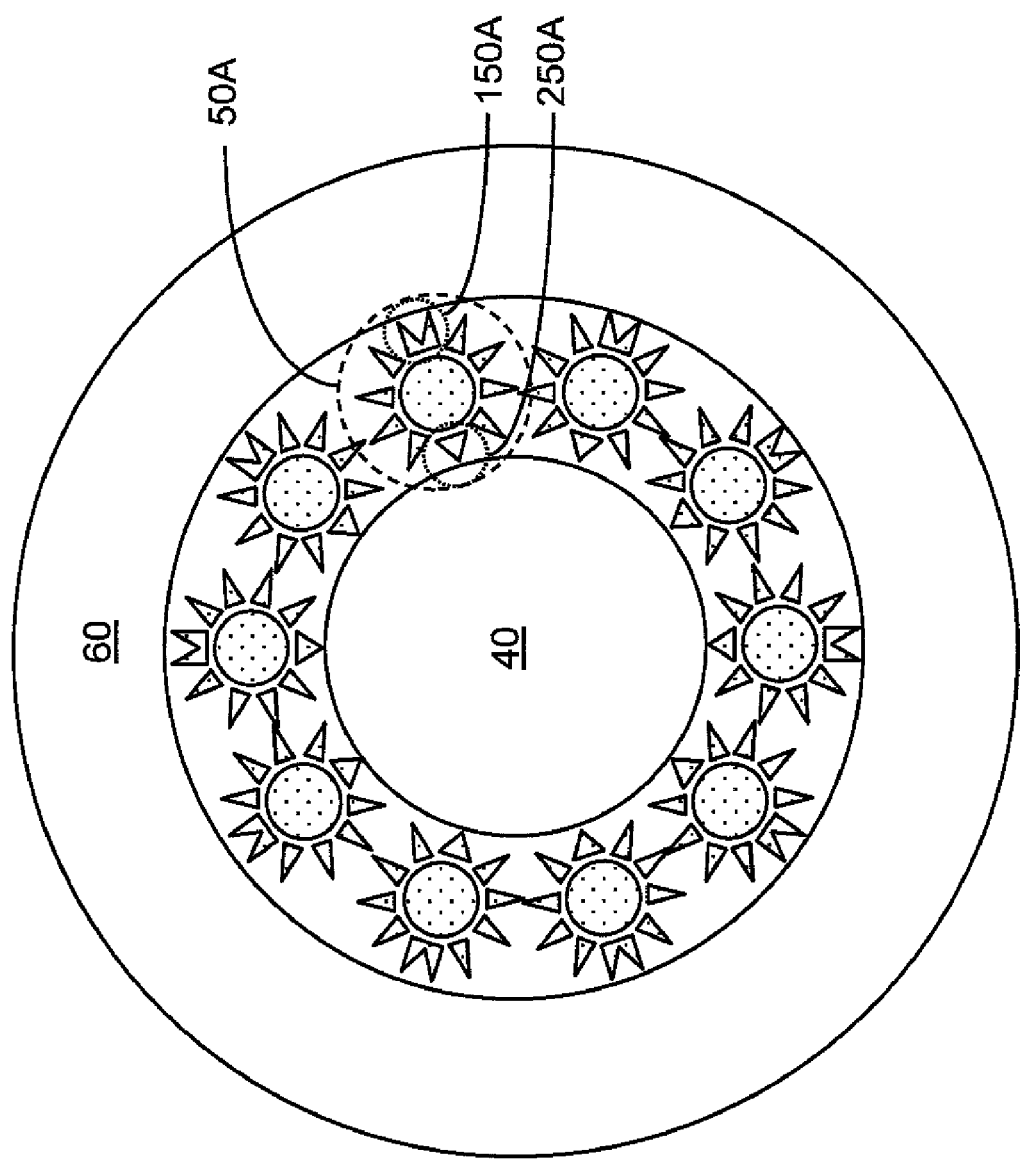

SEMICONDUCTOR NANOWIRE ELECTROMAGNETIC RADIATION SENSOR

FIELD OF THE INVENTION

The present invention relates to semiconductor devices, and particularly to a semiconductor nanowire electromagnetic radiation sensor that detects electromagnetic radiation through electrical charges induced in a semiconductor wire, methods of manufacturing the same, and methods of operating the same.

BACKGROUND OF THE INVENTION

A semiconductor nanowire refers to a semiconductor wire having transverse lateral and vertical dimensions of the order of a nanometer ($10^{-9}$ meter) or tens of nanometers. Typically, the transverse lateral dimension and the vertical dimension are less than 20 nm.

The limitation on the lateral dimension applies to the transverse lateral dimension (the width) and the vertical lateral dimension (the height). The longitudinal lateral dimension (the length) of the semiconductor nanowire is unlimited, and may be, for example, from 1 nm to 1 mm. When the lateral dimensions of the semiconductor nanowire is less than tens of nanometers, quantum mechanical effects become important. As such, semiconductor nanowires are also called semiconductor quantum wires.

The transverse lateral dimension of a semiconductor nanowire is currently sublithographic, i.e., may not be printed by a direct image transfer from a photoresist that is patterned by a single exposure. As of 2008, the critical dimension, i.e., the smallest printable dimension that may be printed by lithographic methods, is about 35 nm. Dimensions less than the critical dimension are called sublithographic dimensions. At any given time, the critical dimension and the range of the sublithographic dimension are defined by the best available lithographic tool in the semiconductor industry. In general, the critical dimension and the range of the sublithographic dimension decreases in each successive technology node and established by a manufacturing standard accepted across the semiconductor industry.

The charge transport property of a semiconductor nanowire is controlled by the charge carriers present in the semiconductor nanowire. A higher density of free charge carriers in the semiconductor nanowire increases the conductivity of the semiconductor nanowire, while a low density of free charge carriers in the semiconductor nanowire decreases the conductivity of the semiconductor nanowire.

SUMMARY OF THE INVENTION

A semiconductor nanowire is coated with a chemical coating (functionalizing) layer that modulates the quantity of free charge carriers within the semiconductor nanowire. The chemical coating layer comprises a functional material that modulates the quantity of free charge carriers within the semiconductor nanowire. A metal compound reacts with the functionalizing layer and forms a dye. The dye layer comprises a material that absorbs electromagnetic radiation. A portion of the absorbed energy induces electronic excitation in the chemical coating layer from which additional free charge carriers are temporarily donated into the semiconductor nanowire. Thus, the conductivity of the semiconductor nanowire changes upon illumination on the dye layer. The semiconductor nanowire and the resulting dye layer collective operate as a detector for electromagnetic radiation.

According to an aspect of the present invention, a semiconductor device is provided, which includes: a semiconductor nanowire located on a substrate and comprising a semiconductor material; and a dye layer including a chemical coating layer and a metallic element containing layer, wherein the dye layer absorbs electromagnetic radiation, and wherein energy from the absorbed electromagnetic radiation induces electronic excitation in the dye layer and alters free charge carrier density in the semiconductor nanowire, wherein the chemical coating layer is located on the semiconductor nanowire and comprises a functional material that selectively attaches to the semiconductor material and react with the metallic element containing layer to form a dye material.

According to another aspect of the present invention, an electromagnetic radiation detector is provided, which includes: a semiconductor nanowire located on a substrate and comprising a semiconductor material; and a dye layer including a chemical coating layer and a metallic element containing layer, wherein the dye layer absorbs electromagnetic radiation, and wherein presence or intensity of electromagnetic radiation is detected by measuring conductivity of the semiconductor nanowire.

According to yet another as aspect of the present invention, a method of forming an electromagnetic radiation detector is provided, which includes: forming a semiconductor nanowire on a substrate and comprising a semiconductor material; forming a chemical coating layer on the semiconductor nanowire and comprising a functional material that selectively attaches to the semiconductor nanowire; and forming a metallic element containing layer on the chemical coating layer, wherein the metallic element containing layer and the chemical coating layer collectively constitute a dye layer that absorbs electromagnetic radiation, and wherein energy from the absorbed electromagnetic radiation induces electronic excitation in the functional material.

According to still another aspect of the present invention, a method of operating an electromagnetic radiation detector is provided, which includes: providing an electromagnetic radiation detector comprising a semiconductor nanowire located on a substrate and comprising a semiconductor material and a dye layer that includes a chemical coating layer and a metallic element containing layer, wherein conductivity of the semiconductor nanowire changes upon exposure of the dye layer to radiation; exposing the dye layer to ambient potentially containing electromagnetic radiation; and measuring conductivity of the semiconductor nanowire while the dye layer is exposed to the electromagnetic radiation.

BRIEF DESCRIPTION OF THE DRAWINGS

FIGS. 1A-1C are various views of an exemplary semiconductor device according to the present invention after patterning of a semiconductor nanowire and first and second semiconductor pads. FIG. 1A is a top-down view, FIG. 1B is a vertical cross-sectional view along the plane B-B' in FIG. 1A, and FIG. 1C is a vertical cross-sectional view along the plane C-C' in FIG. 1A.

FIG. 2A is a top-down view, FIG. 2B is a vertical cross-sectional view along the plane B-B' in FIG. 2A, and FIG. 2C is a vertical cross-sectional view along the plane C-C' in FIG. 2A.

FIG. 3A is a top-down view, FIG. 3B is a vertical cross-sectional view along the plane B-B' in FIG. 3A, and FIG. 3C is a vertical cross-sectional view along the plane C-C' in FIG. 3A.

FIGS. 4A-4C are various views of an exemplary semiconductor device according to the present invention after formation of a chemical coating and a dye layer. FIG. 4A is a top-down view, FIG. 4B is a vertical cross-sectional view along the plane B-B' in FIG. 4A, and FIG. 4C is a vertical cross-sectional view along the plane C-C' in FIG. 4A.

FIG. 5 is a schematic view showing atomic arrangement of semiconductor-bound functionalizing molecules of a functional material in the chemical coating layer.

DETAILED DESCRIPTION OF THE INVENTION

Figure 2C:
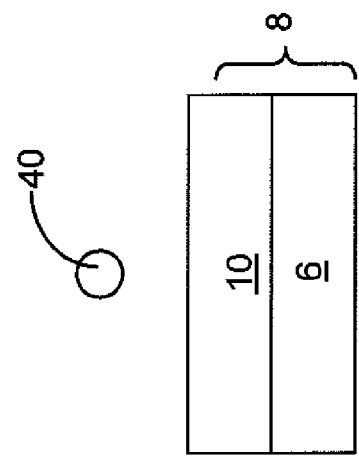
FIGS. 2A-2C are various views of an exemplary semiconductor device according to the present invention after undercutting a buried insulator material from underneath the semiconductor nanowire.

As stated above, the present invention relates to a semiconductor nanowire electromagnetic radiation sensor that detects chemicals through electrical charges induced in a semiconductor wire, methods of manufacturing the same, and methods of operating the same, which are now described in detail with accompanying figures. It is noted that like and corresponding elements are referred to by like reference numerals.

Referring to FIGS. 1A-1C, an exemplary semiconductor structure according to the present invention includes a substrate 8 which contains a handle substrate 6 and an insulator layer 10. A semiconductor nanowire 40 comprising a semiconductor material is formed over the substrate 8. A first semiconductor pad 20 and a second semiconductor pad 30 that comprise a semiconductor material are formed on the substrate 8 such that the first and second semiconductor pads (20, 30) laterally abut a first end portion of the semiconductor nanowire 40 and a second end portion of the semiconductor nanowire 40, respectively.

The semiconductor nanowire 40 and the first and second semiconductor pads (20, 30) may be formed from a semiconductor layer by methods known in the art. For example, a semiconductor-on-insulator (SOI) layer comprising a handle substrate 6, a buried insulator layer, and a top semiconductor layer may be provided for the purposes of the present invention. The top semiconductor layer may be patterned to form the semiconductor nanowire 40 and the first and second semiconductor pads (20, 30). As the top surface of the buried insulator layer becomes exposed after patterning of the top semiconductor layer, the buried insulator layer becomes the insulator layer 10.

The top semiconductor layer comprises a semiconductor material, which may be selected from, but is not limited to silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the top semiconductor layer may include a Si-containing semiconductor material such as single crystalline silicon or a single crystalline silicon-germanium alloy. The semiconductor nanowire 40 and the first and second semiconductor pads (20, 30) have the same composition as the top semiconductor layer. If the semiconductor layer comprises a single crystalline semiconductor material, the entirety of the semiconductor nanowire 40 and the first and second semiconductor pads (20, 30) is a single crystalline semiconductor material having an epitaxial alignment throughout. The first and second semiconductor pads (20, 30) have a thickness greater than the vertical dimension of the semiconductor nanowire 40.

The semiconductor nanowire 40 has a free charge carrier density determined by the free charge carrier concentration. In an unperturbed state, the free charge carrier concentration is determined by the dopant concentration in the semiconductor nanowire 40 and the surrounding pads 20 and 30.

In a preferred embodiment, the semiconductor nanowire 40 comprises a substantially intrinsic semiconductor material and the free charge carrier density is the sum of the density of electrons and the density of holes in the substantially intrinsic semiconductor material of the semiconductor nanowire 40. In this case, the dopant concentration in the semiconductor nanowire 40 is less than $1.0 \times 10^{15}/cm^3$, and is typically less than $1.0 \times 10^{14}/cm^3$. The first and second semiconductor pads (20, 30) may be doped with n-type dopants or p-type dopants to provide a conductivity that is orders of magnitude higher than the conductivity of the semiconductor nanowire 40. If the semiconductor nanowire 40 is substantially intrinsic and has a low conductivity, i.e. high resistivity, the type of doping for the first and second semiconductor pads (20, 30) does not matter because the electrical characteristic of the conduction path including the first semiconductor pad 20, the semiconductor nanowire 40, and the second semiconductor nanowire 30 is resistive due to the high resistance of the semiconductor nanowire 40. Typically, the dopant concentration of the first and second semiconductor pads (20, 30) is from $1.0 \times 10^{19}/cm^3$ to $1.0 \times 10^{21}/cm^3$ in this case, although lesser and greater dopant concentrations are also contemplated herein.

In a first alternate embodiment, the semiconductor nanowire 40 comprises a p-doped semiconductor material and the free charge carrier density is substantially the same as the density of holes in the p-doped semiconductor material of the semiconductor nanowire 40. This is because the minority charge carrier concentration, i.e., the density of electrons, is many orders of magnitude smaller than the density of holes in this case. In other words, the density of holes in the p-doped semiconductor material is substantially the same as the density of p-type dopant atoms in the p-doped semiconductor material of the semiconductor nanowire 40. Typically, the dopant concentration in the semiconductor nanowire 40 is from $1.0 \times 10^{15}/cm^3$ to $1.0 \times 10^{19}/cm^3$, although lesser and greater dopant concentrations are also contemplated herein. The first and second semiconductor pads (20, 30) are doped with p-type or n-type dopants. Typically, the dopant concentration of the first and second semiconductor pads (20, 30) is from $1.0 \times 10^{19}/cm^3$ to $1.0 \times 10^{21}/cm^3$ in this case, although lesser and greater dopant concentrations are also contemplated herein.

In a second alternate embodiment, the semiconductor nanowire 40 comprises an n-doped semiconductor material and the free charge carrier density is substantially the same as the density of electrons in the n-doped semiconductor material of the semiconductor nanowire 40. This is because the minority charge carrier concentration, i.e., the density of holes, is many orders of magnitude smaller than the density of electrons in this case. In other words, the density of electrons in the n-doped semiconductor material is substantially the same as the density of n-type dopant atoms in the n-doped semiconductor material of the semiconductor nanowire 40. Typically, the dopant concentration in the semiconductor nanowire 40 is from $1.0 \times 10^{15}/cm^3$ to $1.0 \times 10^{19}/cm^3$, although lesser and greater dopant concentrations are also contemplated herein. Preferably, the first and second semiconductor pads (20, 30) are doped with n-type or p-type. Typically, the dopant concentration of the first and second semiconductor pads (20, 30) is from $1.0 \times 10^{19}/cm^3$ to $1.0 \times 10^{21}/cm^3$ in this case, although lesser and greater dopant concentrations are also contemplated herein.

The insulator layer 10 is a dielectric material layer, i.e., a layer including a dielectric material. The dielectric material of the insulator layer 10 may be, for example, silicon oxide, silicon nitride, silicon oxynitride, quartz, a ceramic material, or a combination thereof. The thickness of the insulator layer 10 may be from 50 nm to 1,000 nm, although lesser and greater thicknesses are also contemplated herein. The handle substrate 6 may comprise a semiconductor material, an insulator material, or a conductive material. In some cases, the handle substrate 6 and the insulator layer 10 may comprise the same dielectric material and may be of unitary and integral construction.

The semiconductor nanowire 40 and the first and second semiconductor pads (20, 30) may be formed, for example, by lithographic patterning employing photolithography and an anisotropic etch. For example, shapes corresponding to the semiconductor nanowire 40 and the first and second semiconductor pads (20, 30) may be patterned in a photoresist (not shown). The pattern in the photoresist is subsequently transferred by an anisotropic etch into the top semiconductor layer to form the semiconductor nanowire 40 and the first and second semiconductor pads (20, 30). Optionally, the edges of the semiconductor nanowire 40 may be rounded during the anisotropic etch.

The cross-sectional area of the semiconductor nanowire 40 in the C-C' plane may be rectangular, circular, elliptical, or a shape that may be formed by at least one curvilinear shape and/or at least one polygonal shape. Preferably, the cross-sectional area of the semiconductor nanowire 40 is substantially circular, and has a dimension less than 20 nm.

Figure 2A:
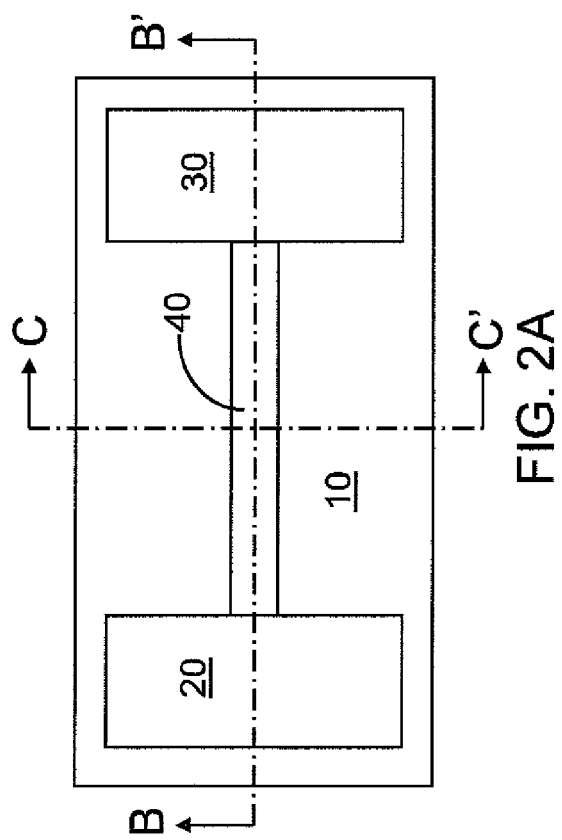
Figure 2B:
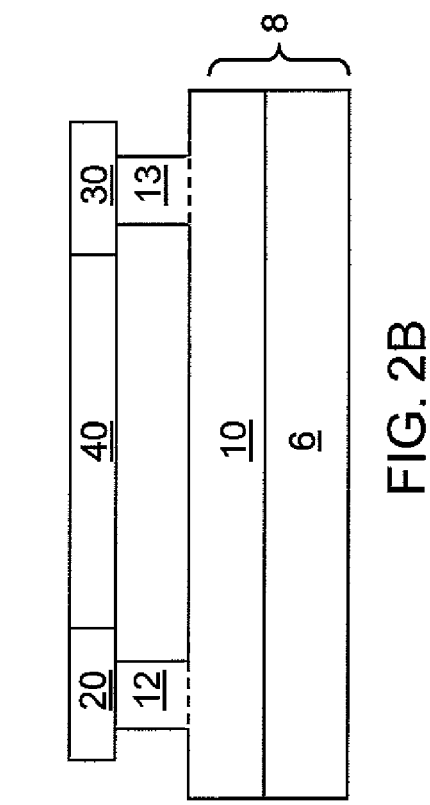

Referring to FIGS. 2A-2C, a substantially isotropic etch is performed on the dielectric material of the insulator layer 10 selective to the semiconductor material of the semiconductor nanowire 40 and the first and second semiconductor pads (20, 30). The semiconductor nanowire 40 and the first and second semiconductor pads (20, 30) are employed as an etch mask for the substantially isotropic etch. The substantially isotropic etch may be a wet etch or a dry etch. Because the etch is substantially isotropic, the semiconductor nanowire 40 and the edges of the first and second semiconductor pads (20, 30) are undercut as the etch progresses. The etch proceeds at least until the portion of the insulator layer 10 located directly underneath semiconductor nanowire 40 is removed. The semiconductor nanowire becomes suspended over the substrate 8 and does not directly contact the substrate 8. In other words, the semiconductor nanowire 40 does not have direct physical contact with the remaining portions of the insulator layer 10.

The etch also removes the dielectric material of the insulator layer 10 from underneath the peripheral portions of the first semiconductor pad 20 and the second semiconductor pad 30. A first insulator pedestal 12 comprising a remaining portion of the insulator layer 10 is formed directly underneath a center portion of the first semiconductor pad 20. Likewise, a second insulator pedestal 13 comprising another remaining portion of the insulator layer 10 is formed directly underneath a center portion of the second semiconductor pad 30. The first insulator pedestal 12 and the second insulator pedestal 13 are of integral construction with the insulator layer 10 and have the same composition as the insulator layer 10.

The semiconductor nanowire 40 may be thinned to reduce the lateral width to a sublithographic dimension, i.e., a dimension that may not be printed directly by lithographic techniques. In case the width of the semiconductor nanowire 40 is a sublithographic dimension, which may be, for example, from 1 nm to 20 nm.

If additional thinning is employed to provide a sublithographic dimension for the lateral width of the semiconductor nanowire 40, the additional thinning may employ thermal conversion of the surface of the semiconductor nanowire 40 into a dielectric material such as a semiconductor oxide, a semiconductor nitride, or a semiconductor oxynitride, followed by removal of the dielectric material. For example, if the semiconductor nanowire 40 includes silicon, the semiconductor oxide material may be silicon oxide, which may be removed by hydrofluoric acid (HF). Alternately or in conjunction, a substantially isotropic etch may be employed to thin the semiconductor nanowire 40 to a sublithographic dimension.

Figure 3C:
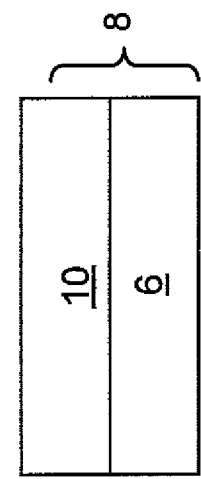
FIGS. 3A-3C are various views of an exemplary semiconductor device according to the present invention after formation of contact vias.
Figure 3A:
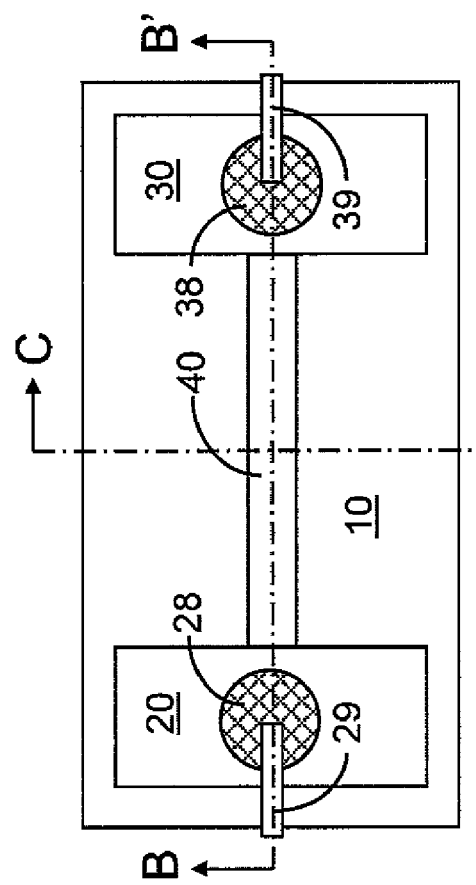
Figure 3B:
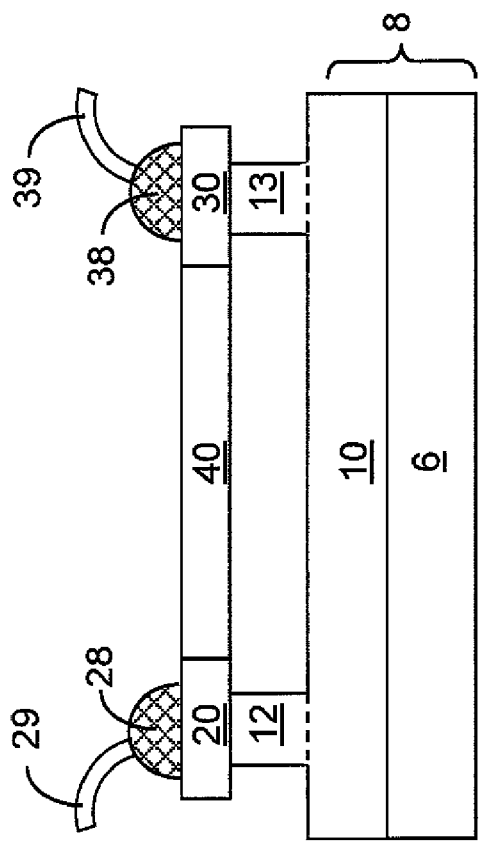

Referring to FIGS. 3A-3C, a first contact structure 28, a second contact structure 38, a first lead wire 29, and a second lead wire 39 are formed by methods known in the art. The first contact structure 28 is formed directly on the first semiconductor pad 20. The second contact structure 38 is formed directly on the second semiconductor pad 30. The first lead wire 29 is formed directly on the first semiconductor pad 20. The second lead wire 39 is formed directly on the second semiconductor pad 30. The first contact structure 28, the second contact structure 38, the first lead wire 29, and the second lead wire 39 collectively enable the measurement of the resistance of the conductive path including the first semiconductor pad 20, the semiconductor nanowire 40, and the second semiconductor pad 30. For example, the first contact structure 28 and the second contract structure 38 may be solder balls, which typically have a lateral dimension from 40 microns to 200 microns. Alternately, the first contact structure 28 and the second contract structure 38 may be a metal-semiconductor alloy pad or a metallic pad having a lateral dimension on the order of 100 microns to enable contact with a test probe. The first lead wire 29 and the second lead wire 39 may be replaced with electrical probes.

Referring to FIGS. 4A-4C, a chemical coating layer 50 and a metallic element containing layer 60 are formed on the exposed surfaces of the semiconductor nanowire 40.

The chemical coating layer 50 is formed directly on the semiconductor nanowire 40. The chemical coating layer 50 may be formed, for example, by dipping the exemplary semiconductor structure in a solution containing the chemical for the chemical coating layer 50. Alternately, the chemical coating layer 50 may be formed by vapor deposition or by a spray. The chemical coating layer 50 includes a functional material that selectively binds to the semiconductor nanowire 40.

The metallic element containing layer 60 is formed directly on the chemical coating layer 50. The metallic element containing layer 60 may be formed, for example, by dipping the exemplary semiconductor structure with a chemical coating in a solution containing a metallic element containing solution. A molecule including a metal element of the metallic element containing solution react with a molecule of the chemical coating layer to form a dye material, which may be a metal organic dye material. The chemical coating layer 50 and the metallic element containing layer 60 are combined to form a dye layer 70. The dye material is formed by complexation of first functional group 150A of the polar molecules in the chemical coating layer with a transition metals of the metallic element containing layer 60. Alternately, the dye layer 70 may be formed by vapor deposition or by a spray with the chemical for the metallic element containing layer 60. The dye layer 70 surrounds and encircles the semiconductor nanowire 40.

The chemical coating layer 50 may be formed on the entirety of the semiconductor nanowire 40. Preferably, the chemical property of the chemical coating layer 50 is such that the chemical coating layer 50 will not be formed on the exposed surfaces of the insulator layer 20. The chemical coating layer 50, the first semiconductor pad 20, and the second semiconductor pad 30 encapsulate the semiconductor nanowire 40.

For example, the functional material of the chemical coating layer 50 may include a semiconductor-bound functionalizing molecule that is self-aligned in the chemical coating layer 50. A semiconductor-bound functionalizing molecule, as defined in the present invention, is a molecule that selectively binds to only to the semiconductor material that the nanowire is made from (such as hydrogen-terminated silicon). It may have a non-zero electrical dipole moment. In other words, the center of positive charge distribution weighted by the probability of the presence of the positive charge is not the same as the center of negative charge distribution weighted by the probability of the presence of the negative charge in such molecule.

FIG. 5 illustrates molecular alignment of the functionalizing molecules 50A within the chemical coating layer 50. In this illustrative example, the chemical coating layer 50 is a monolayer of the functionalizing molecules 50A. The functional material is the molecules 50A.

In this illustrative example, each functionalizing molecule 50A includes a first functional group 150A and a second functional group 250A. A first functional group 150A in each functionalizing molecule 50A is exposed on an exterior surface of the chemical coating layer 50. In this case, each functionalizing molecule 50A may be self-aligned on the surface of the semiconductor nanowire 40 so that the first functional group 150A is on an exterior surface of the chemical coating layer 50. Non-limiting examples of the first functional group 150A include dipyridyl, terpyrydine, and porphyrine. The second functional group 250A bonds to the surface of the semiconductor nanowire 40. Non-limiting examples of the second functional group 250A include diazonium salt, mercapto, phenol, alcohol, alkene, and alkyne.

In general, the second functional group 250A is attached to the semiconductor nanowire 40. If the second functional group 250A is directly bonded to the surface of the semiconductor nanowire 40 and the first functional group 150A is located on the exterior surface of the chemical coating layer 50, the direction along the first functional group 150A and the second functional group 250A in the functionalizing molecule 50A may be a radial direction from a coaxial center line of the semiconductor nanowire 40. The coaxial center line runs along the direction connecting the first semiconductor pad 20 and the second semiconductor pad 30. If the semiconductor nanowire 40 has a circular cross-sectional area, the radial directions converge on the coaxial center line of the semiconductor nanowire 40.

The chemical coating layer 50 may comprises at least one functional material such as porphyrine, dipyridine, terpyridine. Such functional materials for the chemical coating layer 50 are self-aligned on the surface of the semiconductor nanowire such that the dipole moment of the functionalizing molecules are aligned perpendicular to the nearest surface of the semiconductor nanowire 40. These molecules also form a self-assembled monolayer on the semiconductor surface.

The dye layer 70 absorbs electromagnetic radiation. The electromagnetic radiation may be gamma ray, X-ray, ultraviolet radiation, radiation in visible spectrum, or infrared radiation. Preferably, the electromagnetic radiation is ultraviolet radiation, radiation in visible spectrum, or infrared radiation. More preferably, the electromagnetic radiation is ultraviolet radiation or radiation in visible spectrum. Upon absorption of the electromagnetic radiation by the dye layer 70, the energy from the absorbed electromagnetic radiation induces electronic excitation in the functional material of the dye layer 70.

The dye layer 70 may comprise a metal organic dye material. For example, the dye layer 70 may comprise a metal-organic dye material including at least one of a transition metal, Cu, Ru, ft, Ga, In, Tl, Ge, Sn, Pb, Sb, Bi, and Po. As defined herein, transition metals refer to elements in Group 1B, 2B, 3B, 4B, 5B, 6B, 7B, and 8B of the Periodic Table of Elements including Lanthanides and Actinides.

In one example, the dye layer 70 includes a metal organic die containing iridium and has a peak absorption wavelength around 380 nm. In another example, the dye layer 70 includes a metal organic die containing zinc and has a peak absorption wavelength between 320 nm and 350 nm. In yet another example, the dye layer 70 includes a metal organic die containing copper and has a peak absorption wavelength around 300 nm.

The exemplary semiconductor device of the present invention operates as an electromagnetic radiation detector in which the presence or intensity of electromagnetic radiation is detected by measuring conductivity of the semiconductor nanowire 40. The conductivity of the semiconductor nanowire 40 increases upon exposure of the dye layer 70 to electromagnetic radiation of the wavelength that may be absorbed by the dye layer 70.

To determine whether an ambient contains electromagnetic radiation within the wavelength range of the absorption band of the material of the dye layer 70, the dye layer 70 is exposed to an ambient potentially containing such electromagnetic radiation. The conductivity of the semiconductor nanowire 40 is measured while the dye layer 70 is exposed to the electromagnetic radiation. If the conductivity of the semiconductor nanowire 60 increases upon exposure to the testing ambient, the testing ambient has a detectable level of electromagnetic radiation within the wavelength range of the absorption band of the material of the dye layer 70. If the conductivity of the semiconductor nanowire 60 does not change upon exposure to the testing ambient, the testing ambient does not have a detectable level of electromagnetic radiation within the wavelength range of the absorption band of the material of the dye layer 70.

In case the electromagnetic radiation detector detects presence of electromagnetic radiation, the intensity of the electromagnetic radiation may be determined based on the degree of the increase in the conductivity of the semiconductor nanowire 40.

Preferably, the semiconductor nanowire has a dopant concentration less than $1.0 \times 10^{15}/cm^3$ so that the background level conductivity of the semiconductor nanowire in the absence of electromagnetic radiation may be minimized and the signal-to-noise ratio of the electromagnetic radiation detector may be increased.

The conductivity of the semiconductor nanowire 40 may be measured by measuring the resistance of the semiconductor nanowire 40. For example, the resistance of the semiconductor nanowire 40 may be measured by applying an electrical bias between the first and second semiconductor pads (20, 30) and measuring current through the first semiconductor pad 20, the semiconductor nanowire 40, and the second semiconductor pad 30. The first contact structure 28, the second contact structure 38, the first lead wire 29, and the second lead wire 39 may be employed as the path of electrical current for measurement of the resistance of the semiconductor nanowire 40.

Figure 6:
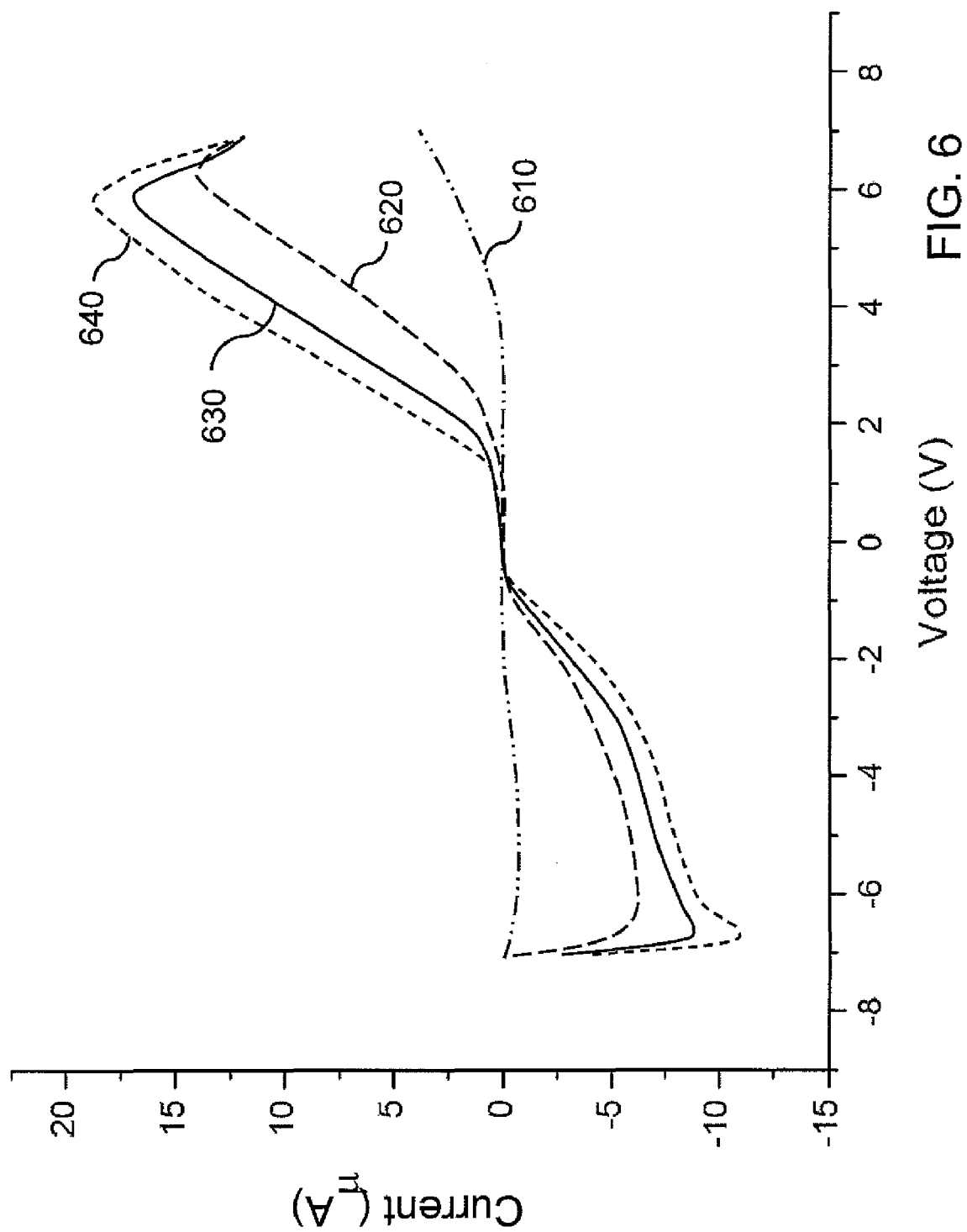
FIG. 6 is a graph of current through the semiconductor nanowire under electrical bias after formation of a chemical coating layer and exposure to light, and after formation of a dye layer and exposure to light at various intensities.

FIG. 6 is a graph illustrating the operation of the semiconductor nanowire device of the present invention. A first voltage-current curve 610 represents electrical current through the semiconductor nanowire 40 of FIGS. 4A-4C without the metallic element containing layer 60, i.e., the semiconductor nanowire device of the present invention including the chemical coating layer 50 but not including the metallic element containing layer 60. In this case, the chemical coating layer 50 includes a monolayer of terpyridine formed by dipping the semiconductor nanowire device of FIGS. 3A-3C into a solution of terpyridine. Alternately, the chemical coating layer 50 of terpyridine may be formed by any other method of applying a thin coating of terpyridine. The semiconductor nanowire 40 includes substantially intrinsic single crystalline silicon having a dopant concentration less than $1.0\times10^{15}/cm^3$.

A second voltage-current curve 620 represents electrical current through the semiconductor nanowire 40 of FIGS. 4A-4C measured in the absence of any electromagnetic radiation. The semiconductor nanowire 40 is surrounded by the dye layer 70, which contains the dye layer 70 including the chemical coating layer 50 and the metallic element containing layer 60. The semiconductor nanowire 40 includes substantially intrinsic single crystalline silicon having a dopant concentration less than $1.0\times10^{15}/cm^3$. The dye layer 70 includes a metal organic dye including ruthenium. The presence of the dye layer 70 shifts the baseline response curve for the electrical current under electrical bias relative to the first voltage-current curve 610, which is a curve in the absence of the dye layer 70.

A third voltage-current curve 630 represents electrical current through the semiconductor nanowire 40 of FIGS. 4A-4C while the dye layer 70 is exposed to a low level of electromagnetic radiation. The semiconductor nanowire 40 includes substantially intrinsic single crystalline silicon having a dopant concentration less than $1.0\times10^{15}/cm^3$. The dye layer 70 includes the same metal organic dye that includes ruthenium. The low level of radiation shifts the response curve for the electrical current under electrical bias relative to the second voltage-current curve 620. Specifically, the additional free charge carriers are introduced from the dye layer 70 as the electromagnetic radiation is absorbed in the dye layer 70. Thus, more current flows through the semiconductor nanowire 40 due to the additional free charge carriers in the semiconductor nanowire 40, and the third voltage-current curve 630 shows higher level of electrical current relative to the second voltage-current curve 620.

A fourth voltage-current curve 640 represents electrical current through the semiconductor nanowire 40 of FIGS. 4A-4C while the dye layer 70 is exposed to a high level of electromagnetic radiation. The semiconductor nanowire 40 includes substantially intrinsic single crystalline silicon having a dopant concentration less than $1.0\times10^{15}/cm^3$. The dye layer 70 includes the same metal organic dye that includes ruthenium. The high level of radiation further shifts the response curve for the electrical current under electrical bias relative to the third voltage-current curve 630. The number of additional free charge carriers that are introduced from the dye layer 70 into the semiconductor nanowire 40 increases as more electromagnetic radiation is absorbed in the dye layer. Thus, even more current flows through the semiconductor nanowire 40 due to the additional free charge carriers in the semiconductor nanowire 40 relative to the case of the low level of electromagnetic radiation, and the fourth voltage-current curve 640 shows higher level of electrical current relative to the third voltage-current curve 630.

Thus, the electromagnetic radiation detector of the present invention may detect not only presence or absence of electromagnetic radiation within the absorption wavelength range of the dye layer 70 but also the intensity of the electromagnetic radiation in a testing ambient.

While the present invention is described employing an embodiment in which the chemical coating layer 50 and the metallic element containing layer 60 are formed after the formation of the first and second contact structures (28, 38), embodiments in which the chemical coating layer 50 and the metallic element containing layer 60 are formed prior to the formation of the first and second contact structures (28, 38) are explicitly contemplated herein. Further, instead of employing a single semiconductor nanowire 40, the present invention may be practiced with a plurality of semiconductor nanowires 40 that are connected in parallel to increase signal strength as a detector. Such variations are explicitly contemplated herein.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor device comprising:
   a semiconductor nanowire located on a substrate and comprising a semiconductor material; and
   a dye layer including a chemical coating layer and a metallic element containing layer, wherein said dye layer absorbs electromagnetic radiation, and wherein energy from said absorbed electromagnetic radiation induces electronic excitation in said dye layer and alters free charge carrier density in said semiconductor nanowire, wherein said chemical coating layer is located on said semiconductor nanowire and comprises a functional material that selectively attaches to said semiconductor material and react with said metallic element containing layer to form a dye material.

2. The semiconductor device of claim 1, wherein said semiconductor nanowire has a dopant concentration less than $1.0\times10^{15}/cm^3$.

3. The semiconductor device of claim 1, further comprising:
   a first semiconductor pad located on said substrate and laterally abutting a first end portion of said semiconductor nanowire; and
   a second semiconductor pad located on said substrate and laterally abutting a second end portion of said semiconductor nanowire.

4. The semiconductor device of claim 3, further comprising an insulator layer located in said substrate and vertically abutting said first semiconductor pad and said second semiconductor pad.

5. The semiconductor device of claim 3, wherein said semiconductor nanowire is suspended over said substrate and does not directly contact said substrate.

6. The semiconductor device of claim 3, wherein said chemical coating layer, said first semiconductor pad, and said second semiconductor pad encapsulate said semiconductor nanowire.

7. The semiconductor device of claim 6, wherein said dye layer (formed by reaction with the said chemical coating layer) surrounds and encircles said semiconductor nanowire.

8. The semiconductor device of claim 1, wherein said functional material includes a functionalizing molecule that is self-aligned in said chemical coating layer, wherein a functional group in said functionalizing molecule is exposed on an exterior surface of said chemical coating layer.

9. The semiconductor device of claim 8, wherein said functionalizing molecule includes another functional group located in closer proximity to said semiconductor nanowire than said functional group in said functionalizing molecule.

10. The semiconductor device of claim 9, wherein a direction along said functional group and said another functional group in said functionalizing molecule is a radial direction from a coaxial center line of said semiconductor nanowire.

11. The semiconductor device of claim 8, wherein said chemical coating layer is a monolayer of said functionalizing molecule.

12. The semiconductor device of claim 8, wherein said functionalizing molecule is one of porphyrine, dipyridine, terpyridine.

13. The semiconductor device of claim 8, wherein said electromagnetic radiation is gamma ray, X-ray, ultraviolet radiation, radiation in visible spectrum, or infrared radiation.

14. The semiconductor device of claim 8, wherein said dye layer comprises a metal-organic dye material.

15. The semiconductor device of claim 14, wherein said dye layer comprises a metal-organic dye material including at least one of a transition metal, Cu, Ru, Ir, Ga, In, Tl, Ge, Sn, Pb, Sb, Bi, and Po.

16. An electromagnetic radiation detector comprising:
    a semiconductor nanowire located on a substrate and comprising a semiconductor material; and
    a dye layer including a chemical coating layer and a metallic element containing layer, wherein said dye layer absorbs electromagnetic radiation, and wherein presence or intensity of electromagnetic radiation is detected by measuring conductivity of said semiconductor nanowire.

17. The electromagnetic radiation detector of claim 16, wherein energy from said absorbed electromagnetic radiation induces electronic excitation in said functional material.

18. The electromagnetic radiation detector of claim 16, wherein said chemical coating layer comprises at least one of porphyrine, dipyridine, terpyridine.

19. The electromagnetic radiation detector of claim 16, wherein said dye layer comprises an organic dye material.

20. A method of forming an electromagnetic radiation detector comprising:
    forming a semiconductor nanowire on a substrate and comprising a semiconductor material;
    forming a chemical coating layer on said semiconductor nanowire and comprising a functional material that alters free charge carrier density in said semiconductor nanowire upon electronic excitation; and
    forming a metallic element containing layer on said chemical coating layer, wherein said metallic element containing layer and said chemical coating layer collectively constitute a dye layer that absorbs electromagnetic radiation, and wherein energy from said absorbed electromagnetic radiation induces electronic excitation in said functional material.

21. The method of claim 20, further comprising forming a first semiconductor pad and a second semiconductor pad on said substrate, wherein said first and second semiconductor pads laterally abut a first end portion and a second end portion, respectively, of said semiconductor nanowire.

22. The method of claim 19, wherein said substrate includes an insulator layer that vertically abuts said first semiconductor pad and said second semiconductor pad, wherein said semiconductor nanowire is suspended over said substrate and does not directly contact said substrate, and wherein said semiconductor nanowire and said first and second semiconductor pads comprise a single crystalline semiconductor material having an epitaxial alignment throughout.

23. A method of operating an electromagnetic radiation detector comprising:
    providing an electromagnetic radiation detector comprising a semiconductor nanowire located on a substrate and comprising a semiconductor material and a dye layer that includes a chemical coating layer and a metallic element containing layer, wherein conductivity of said semiconductor nanowire increases upon exposure of said dye layer to radiation;
    exposing said dye layer to an ambient potentially containing electromagnetic radiation; and
    measuring conductivity of said semiconductor nanowire while said dye layer is exposed to said electromagnetic radiation.

24. The method of claim 23, wherein said dye layer undergoes electronic excitation upon absorption of electromagnetic radiation which alters free charge carrier density in said semiconductor nanowire.

25. The method of claim 23, wherein said chemical detector further comprises a first semiconductor pad and a second semiconductor pad on said substrate, wherein said first and second semiconductor pads laterally abut a first end portion and a second end portion, respectively, of said semiconductor nanowire, and wherein said resistance of said semiconductor nanowire is measured by applying an electrical bias between said first and second semiconductor pads and measuring current through said first semiconductor pad, said semiconductor nanowire, and said second semiconductor pad.

* * * * *